United States Patent
Deppisch et al.

(10) Patent No.: US 8,550,327 B2
(45) Date of Patent: Oct. 8, 2013

(54) CLAD SOLDER THERMAL INTERFACE MATERIAL

(75) Inventors: Carl L. Deppisch, Chandler, AZ (US); Rajasekaran Swaminathan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/020,152

(22) Filed: Feb. 3, 2011

(65) Prior Publication Data

US 2011/0147914 A1    Jun. 23, 2011

Related U.S. Application Data

(62) Division of application No. 12/646,255, filed on Dec. 23, 2009, now abandoned.

(51) Int. Cl.
*B23K 31/02*      (2006.01)

(52) U.S. Cl.
USPC .......................................... 228/56.3; 228/117

(58) Field of Classification Search
USPC ................. 228/117, 56.3, 235.2, 245, 193; 257/E23.023; 428/609, 653, 677, 685
See application file for complete search history.

(56) References Cited

U.S. PATENT DOCUMENTS

| | | | | |
|---|---|---|---|---|
| 1,248,506 | A * | 12/1917 | Levine | 428/672 |
| 5,377,899 | A * | 1/1995 | Hashimoto | 228/117 |
| 5,881,944 | A * | 3/1999 | Edwards et al. | 228/56.3 |
| 6,319,617 | B1 * | 11/2001 | Jin et al. | 428/469 |
| 7,164,585 | B2 * | 1/2007 | Jadhav et al. | 361/705 |
| 2005/0121776 | A1 | 6/2005 | Deppisch et al. | |
| 2008/0206590 | A1 * | 8/2008 | Ikeda et al. | 428/650 |

* cited by examiner

*Primary Examiner* — Roy King
*Assistant Examiner* — Michael Aboagye
(74) *Attorney, Agent, or Firm* — Blakely, Sokoloff, Taylor & Zafman LLP

(57) ABSTRACT

A clad solder thermal interface material is described. In one example the material has a a first layer of solder having a melting temperature lower than a temperature of a particular solder reflow furnace, a second layer of solder clad to the first layer of solder, the second layer having a melting temperature higher than the temperature of the solder reflow furnace, and a third layer of solder clad to the second layer of solder opposite the first layer, the third layer having a melting temperature lower than the temperature of the solder reflow furnace.

14 Claims, 2 Drawing Sheets

CLAD SOLDER THERMAL INTERFACE MATERIAL

CROSS-REFERENCE TO RELATED APPLICATIONS

The present application is a division of prior filed U.S. patent application Ser. No. 12/646,255, filed Dec. 23, 2009, now abandoned entitled Clad Solder Thermal Interface Material, the priority of which is hereby claimed.

FIELD

The present description relates to the field of solder construction for microelectronic and micromechanical packages and, in particular, to a clad solder with hybrid thermal properties.

BACKGROUND

In the assembly of microelectronic and micromechanical packages and other assemblies, solder is used to make electrical connections for thermal connection and for physical attachments. A package can have several different solder connections that are made at different times. Similarly, a printed wiring board, case and other devices can also have several different solder connections that are all made at different times. Each solder connection is made by applying heat to melt the solder and make the connection. Frequently reflow ovens are used which heat the entire system to melt the solder onto the connection.

When the device is constructed, care must be taken to ensure that previous soldering is not damaged by later soldering. If a first solder joint is made and then the device or the solder joint is heated beyond the melting temperature of the first solder joint, then the first solder joint may be damaged.

BRIEF DESCRIPTION OF THE DRAWINGS

Embodiments of the present invention are illustrated by way of example, and not limitation, in the figures of the accompanying drawings in which like reference numbers are used to refer to like features, and in which.

DETAILED DESCRIPTION

A STIM (Solder Thermal Interface Material) is described that can be reflowed at temperatures less than 200° C. allowing the use of current assembly materials and process equipment. This STIM remains in a solid state throughout the heating from BGA (Ball Grid Array) reflow. As a result, voiding is reduced and Rjc (thermal resistance) performance is improved.

With PTIM (Polymer Thermal Interface Material), the thermal performance may be poor. With low melting temperatures, for example below 260° C., metallic solder TIM (Thermal Interface Material), for example, In, Sn or SnCu, there are voiding and pump out issues that occur upon reflowing for BGA packages.

A clad material allows low melting temperature skins to be joined to a higher melting temperature core. Such a clad solder can be reflowed at a lower temperature, for example 200° C., to allow the low temperature skin to melt and react with materials to be connected and to the core solder material. This low temperature reflow produces a homogenous material with a higher melting temperature, for example greater than 260° C. The high melting temperature allows the resultant material to remain solid throughout BGA reflows and other higher temperatures processes.

Considering the clad material in more detail, a high melting temperature solder such as AuSn or SnSb can be used as the core. These materials present a melting temperature above 260° C. This temperature is a good target because it is a safe margin higher than a typical temperature inside a solder reflow furnace. A reflow furnace used for soldering a BGA to a substrate is heated to about 230° C. However, other materials can be used to achieve different temperature targets. Other materials might include PbAg eutectic, AuGe eutectic, and other alloys that have a solidus above about 250° C. If the solder is to be used for other processes that are performed at other temperatures, then different materials with higher or lower melting temperatures can be selected.

The inner solder core is clad to an outer solder skin that has a lower melting temperature, for example less than less than 200° C. This temperature is well below the temperature of the BGA reflow furnace. However, other temperatures may be selected for other applications. Suitable materials for the outer solder skin include SnBi, SnBi eutectic, SnIn eutectic, InAg, In, SnPb, SnGa, and InGa, SAC305, among others.

The cladding can be done with a standard rolling mill at room temperature. The particular parameters used for the rolling, such as temperatures, pressures, dimensions of the stock, etc. can be adapted to suit the particular materials involved and the particular application for the clad solder materials.

Figure 1:
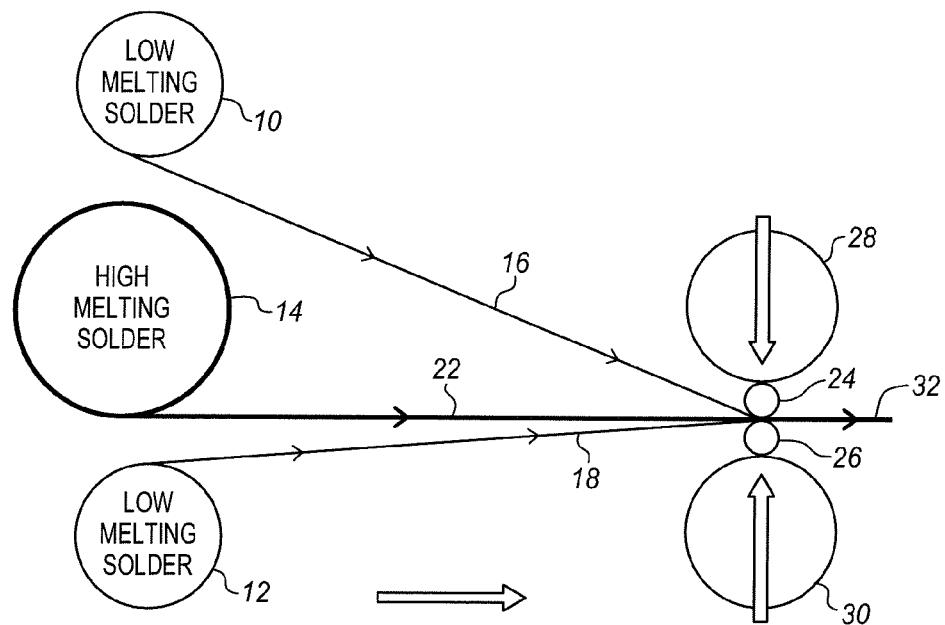
FIG. 1 is a diagram of forming a clad solder according to an embodiment of the present invention.

FIG. 1 shows an upper coil of low melting point solder 10 and a lower coil of low melting point solder 12. These are typically, but not necessarily the same material. The upper and lower materials can be adapted to suit the materials that they will be used with, depending on the particular application. Between these two coils is a coil of higher melting point solder 14. The coils produce an upper strip 16, a lower strip 18, and a middle strip 22, that are supplied to the rolling mill. The strips are guided between upper and lower rollers 24, 26 that are driven by larger rollers 28, 30 to press the strips together under pressure. After rolling, the upper and lower strips are clad to the middle strip.

The metallurgical bond generated by cladding is accomplished by a massive reduction in the cross-sectional area of the three strips at the bonding rolls 24, 26. This creates new metal surfaces which are forced into contact with each other without exposure to the ambient atmosphere. The resulting clad material 32 can be used as is, or stamped to form preforms.

As mentioned above, the clad solder can be used in a variety of different processes. In one example, it is used to attach an IHS (Integrated Heat Spreader) to a die that is to be attached to a substrate through a BGA.

In this example, the clad solder is reflowed at a lower temperature to allow the skin to melt and react with the IHS and die and the core solder material. For a clad solder with an AuSn core and a SnBi skin, depending upon the thickness of the skin and the core and the time in the oven, this produces a homogenous material throughout the whole STIM with a melting temperature greater than 260° C. The resultant material will remain solid throughout BGA reflows and hence can be used as a BGA STIM (Solder Thermal Interface Material) solution.

The thickness of the outer skin or cladding relative to the inner core will determine whether and how quickly the whole STIM becomes homogeneous. Thin layers may combine in the lower temperature reflow oven. Somewhat thicker layers will combine over time as the metals migrate across each other. However, if the layers are too thick, then the STIM will not reach homogeneity. While homogeneity provides a strong joint, it is not necessary to secure a package cover to a die. In any event, the STIM will also combine with metallization layers on the surfaces being soldered together to further strengthen this bond.

Figure 2:
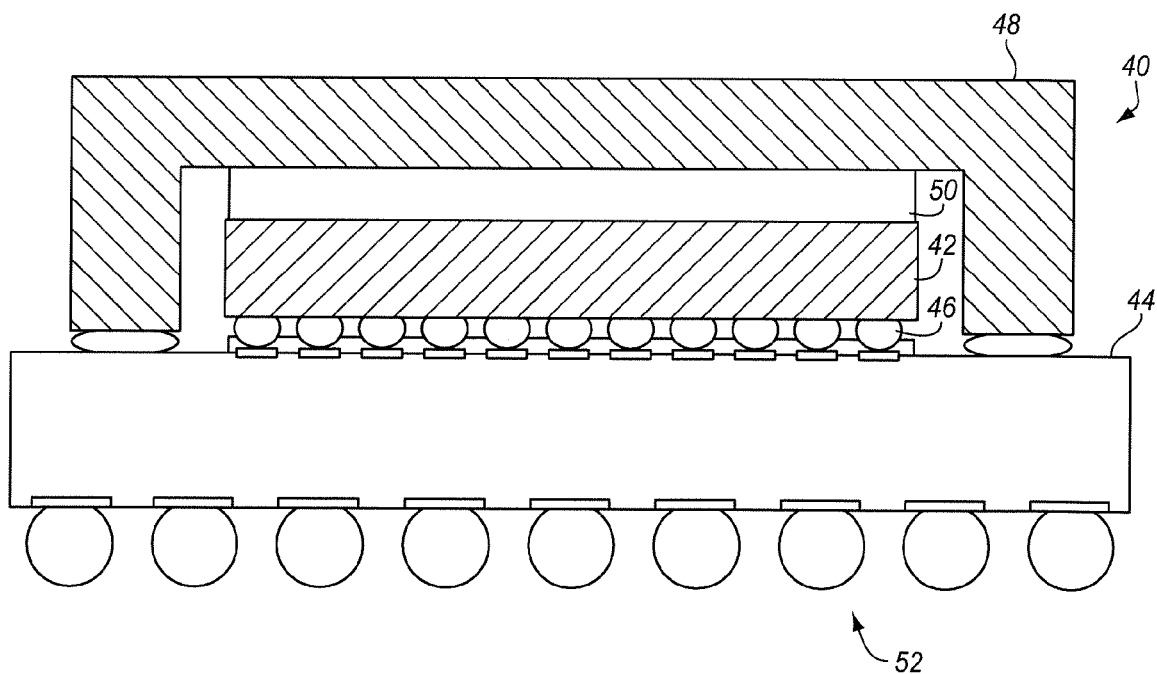
FIG. 2 is a side cross-sectional diagram of a flip-chip package to which embodiments of the present invention may be applied.

FIG. 2 shows an example of a flip-chip package 40 to which embodiments of the present invention may be applied. A die 42 at the center of the package is coupled to a substrate 44 using a first level interconnect 46. This connection can be with solder balls, solder bumps, compression pads or any of a variety of other connections. An IHS is attached to the substrate 44 and to the die 42 to encapsulate the die. The IHS encloses and protects the die and also serves as heat sink or spreader. The IHS may have fins, ribs, a plate, or a contact pad to connect to a cooling device depending on the particular application and the type of die.

In one embodiment, the IHS is attached to the die with the STIM (Solder Thermal Interface Material) 50 described above. The STIM 50 not only holds the pieces together but conducts heat from the die to the IHS. The die may have specific heat paths through the die to conduct heat from within the die to the IHS. In addition, the die may have a top surface metallization layer for heat conduction to the IHS. In the illustrated example, the package has a BGA 52 across the bottom for electrical attachment to another device, for example, a printed wiring board.

The BGA array is typically formed by applying solder balls across the connection points of the substrate. Solder is then applied to the package and the package is pasted to the board. The board and package are then placed in a reflow furnace that melts the solder to make an electrical and physical connection between the package and the board.

In one example, the BGA is soldered to the board using SnCu solder. This solder has a melting temperature of 227° C. A reflow temperature above 235° C. is typically used to form the joint.

Using the clad solder described above, only the outer cladding layers need to be melted. Accordingly, at the lower melting temperatures of the oven, the outer skin is reflowed to form a joint between the die and the IHS. The outer cladding layer may be selected to have a reflow temperature close to indium as with, for example, SnBi, which melts at 138° C.

Because it is not necessary to reflow at higher temperatures, there is less stress on the package, less chances for warping the package and the board, less propensity for push out and less voiding. In addition, the residual stresses at the solder interface will be lower.

Additionally, because the final homogenized solder between the die and the IHS will have a melting temperature greater than 260° C., the solder joint will be solid during preconditioning conditions. This further reduces voiding and pump out. In preconditioning, the package is exposed to extreme thermal conditions to test for reliability and durability.

Figure 3:
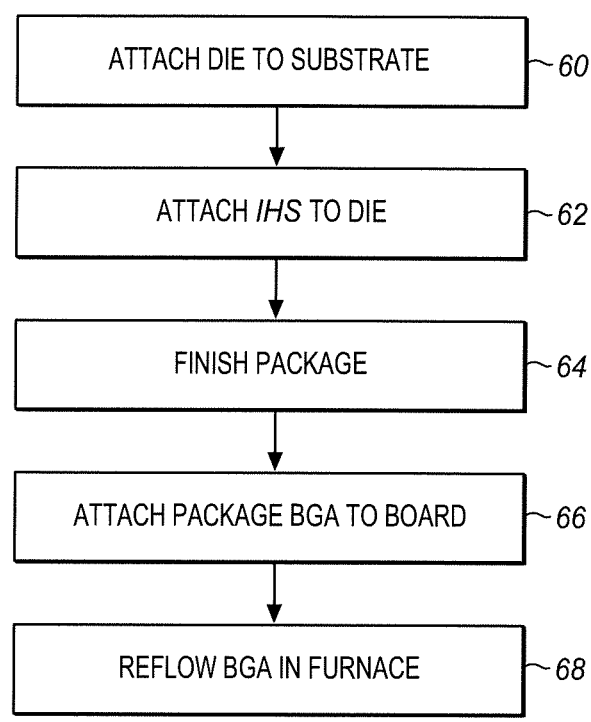
FIG. 3 is a process flow diagram of assembling a package and mounting it to a board using clad solder according to an embodiment of the present invention.

FIG. 3 shows a process flow suitable for assembling a BGA package using the clad solder TIM described above. At block 60, the die 42 is attached to the substrate 44 of the package. This can be done in a variety of ways including applying solder balls and then loading the package into a reflow furnace.

At block 62, the package cover, for example an IHS is attached to the die and the substrate. The cover is bonded to the die by the STIM by melting the outer cladding of the STIM so that it bonds to the die on one side and to the cover on the other side. Using the clad solder described above, this can be done at a low temperature such as temperature less than 200° C. and as low as 150° C. The temperature is sufficient to melt the outer layers of the clad solder. This temperature is selected to be lower than the melting point of the solder connecting the die to the substrate and so that connection is not affected. At block 64, the package is finished as desired for its application. This can include the application of additional layer, tape stripes, handling points, cooling devices, etc.

At block 66, the finished package is mounted to a printed wiring board or any other suitable substrate. This can be done in any of a variety of ways, depending on the application. In one example a solder tape strip is applied to the package which is then placed in position on the board. In another example, solder balls and adhesive are applied to the package which is then placed on the board. At block 68, the solder balls are reflowed. This can be done in a reflow furnace. The furnace heat melts the solder balls to make the connections between the package and the board.

For the BGA reflow process, a typical furnace temperature will be 235° C. or above. This temperature is above the melting temperature of the outer cladding of the STIM but below the melting temperature of the inner layer of the clad STIM. Because the clad solder becomes a single layer after the first reflow 62, the STIM is not affected by the BGA reflow temperature. The melting temperature of the STIM is now determined primarily by the inner layer which is selected to have a melting temperature above that of the BGA solder. In the examples above, the STIM will have a melting temperature of about 260° C.

While the present invention has been described in the context of a flip-chip package with integrated heat spreader, the clad solder can be used in many other applications. These include applications such as dies bonded to heat sinks, heat sinks bonded to heat spreaders, or dies bonded to a heat spreader such as an IHS, where the die uses a BGA package or some other type of package. The clad solder can be used in many other applications in which a first lower temperature is desired to form a joint which can safely survive a much higher temperature. In addition while the solder is described in the context of a thermal interface, the material is also electrically conductive. Accordingly, it can also be used to make electrical connections and combinations of electrical and thermal connections.

Various operations are described as multiple discrete operations to aid in understanding the description. However, the order of description should not be construed to imply that these operations are necessarily order dependent. In particular, these operations need not be performed in the order of presentation. Operations described may be performed in a different order than the described embodiment. Various additional operations may be performed and described operations may be omitted.

A lesser or more complex combination of solder layers, rolling operation, and package construction may be used than those shown and described herein. Therefore, the configurations may vary from implementation to implementation depending upon numerous factors, such as price constraints, performance requirements, technological improvements, or other circumstances. Embodiments of the invention may also be applied to other types of packages and connections that benefit from different types of solders, temperatures conditions, and surface connections. In addition, the particular materials and combinations of materials rolled together to form the clad solder can be adapted to different applications.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In addition, steps and operations may be removed or added to the operations described to improve results or add additional functions. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A clad solder with a core and a skin comprising:
  an AuSn core; and
  a skin clad on either side of the core, the skin comprising at least one of SnBi, SnIn and SnGa.

2. The clad solder of claim 1, further comprising a semiconductor die and a die cover, wherein the solder is melted by a solder reflow furnace to form a joint between the die and the cover.

3. The clad solder of claim 2, wherein the die cover comprises an integrated heat spreader and wherein the solder is melted only in the first and third layers.

4. The clad solder of claim 2, wherein the cover and the die form at least a portion of a package.

5. The clad solder of claim 2, wherein the joint between the die and the cover comprises a homogenous material formed from the core and the skin.

6. The clad solder of claim 2, wherein the joint between the die and the cover comprises a bond of the skin of the solder to the die cover and a bond of the skin of the solder to the die.

7. The clad solder of claim 1, wherein the core and the skin are clad by rolling the strips together.

8. The clad solder of claim 7, wherein the rolling establishes a metallurgical bond between the skin and core.

9. The clad solder of claim 8, wherein the metallurgical bond is established by forcing the skin and the core into contact without exposure to the ambient.

10. The clad solder of claim 1, wherein the thicknesses of the skin layers are formed so that the material becomes a homogenous material when heated to a temperature higher than the melting temperature of the skin and lower than the melting temperature of the core.

11. The clad solder of claim 10, wherein the homogeneous material has a melting temperature higher than the melting temperature of the skin.

12. A solder thermal interface material comprising:
  a first layer of solder formed of at least one of SnBi, SnIn and SnGa;
  a second layer of solder clad to the first layer of solder, the second layer being formed of before AuSn; and
  a third layer of solder clad to the second layer of solder opposite the first layer, the third layer formed of at least one of SnBi, SnIn and SnGa.

13. A solder thermal interface material comprising:
  an outer skin of a first SnBi solder having a melting temperature lower than a predetermined solder reflow temperature;
  an inner core of a second AuSn solder having a melting temperature higher than the solder reflow temperature,
  wherein the outer skin is clad to the inner core with a metallurgical bond.

14. The material of claim 13, wherein the thickness of the skin is such that when the material is exposed to a temperature higher than the melting temperature of the outer skin and lower than the melting temperature of the inner core, the material becomes a homogenous material.

\* \* \* \* \*